United States Patent [19]

Carpenter et al.

[11] Patent Number: 5,495,665
[45] Date of Patent: Mar. 5, 1996

[54] PROCESS FOR PROVIDING A LANDLESS VIA CONNECTION

[75] Inventors: Richard W. Carpenter, Johnson City; Robert E. Ruane, Endicott, both of N.Y.

[73] Assignee: International Business Machines Corporation, Armonk, N.Y.

[21] Appl. No.: 336,107

[22] Filed: Nov. 4, 1994

[51] Int. Cl.$^6$ .................................................. H05K 3/36
[52] U.S. Cl. .............................. 29/830; 174/262; 427/96
[58] Field of Search .......................... 29/830; 174/260, 174/262, 266; 427/96; 428/901

[56] References Cited

U.S. PATENT DOCUMENTS

| | | |
|---|---|---|
| 3,011,920 | 12/1961 | Shipley, Jr. . |
| 3,099,608 | 7/1963 | Radovsky et al. . |
| 3,844,799 | 10/1974 | Underkofler et al. . |
| 4,066,809 | 1/1978 | Alpaugh et al. . |
| 4,152,467 | 5/1979 | Alpaugh et al. . |
| 4,478,883 | 10/1984 | Bupp et al. . |
| 4,528,072 | 7/1985 | Kurosawa et al. ................ 29/830 |
| 4,554,182 | 11/1985 | Bupp et al. . |
| 4,704,791 | 11/1987 | Chellis et al. . |
| 5,065,228 | 11/1991 | Foster et al. . |
| 5,108,553 | 4/1992 | Foster et al. . |
| 5,263,243 | 11/1993 | Taneda et al. ............. 174/262 X |
| 5,315,072 | 5/1994 | Arai et al. ....................... 174/262 |
| 5,418,689 | 5/1995 | Alpaugh et al. . |

FOREIGN PATENT DOCUMENTS

| | | | |
|---|---|---|---|
| 5-218660 | 8/1993 | Japan .............................. 427/96 |
| 5-327227 | 12/1993 | Japan .............................. 427/96 |
| 6-77652 | 3/1994 | Japan .............................. 427/96 |

OTHER PUBLICATIONS

Chumbres et al., Landless Plated–Through Hole Photoresist Masking Process, IBM Technical Disclosure Bulletin, vol. 15, No. 10, Mar. 1973, pp. 3298–3299.

Crimi et al., Landless Hole Circuit Card IBM Technical Disclosure Bulletin, vol. 9, No. 10, Mar. 1967, pp. 1310–1311.

Johnson, Wafer Voltage Distribution, IBM Technical Disclosure Bulletin, vol. 18, No. 6, Nov. 1975, p. 1851.

Howrilka et al., Improved, Rapid Process for Cleaning "Blind" Via Holes in a Circuit Board, IBM Technical Disclosure Bulletin, vol. 22, No. 4, Sep. 1979, p. 1417.

*Primary Examiner*—Carl J. Arbes
*Attorney, Agent, or Firm*—Pollock, Vande Sande & Priddy

[57] ABSTRACT

A process for connecting at least two electrically conductive patterns through a dielectric material by a landless electrical connection is provided. The process includes providing a composite containing a dielectric substrate having a conductive plane on at least one of its major surfaces and a temporary support layer covering the conductive plane. Blind vias are provided in the dielectric substrate and are plated with an electrically conductive material. The temporary support layer is removed thereby providing a landless electrical connection through the dielectric material and the conductive plane is available for providing external electrical conductive pattern.

10 Claims, 3 Drawing Sheets

PROCESS FOR PROVIDING A LANDLESS VIA CONNECTION

TECHNICAL FIELD

The present invention is concerned with a process for connecting at least two electrical conductors through a dielectric material. In particular, the present invention is concerned with a process for providing landless plated vias in a dielectric material.

BACKGROUND ART

In the manufacture of printed circuit cards and boards, a dielectric sheet material is employed as the substrate. A conductive circuit pattern is provided on one or both of the major surfaces of the substrate.

In order to provide an electrical connection between layers, metal coated vias are provided. In providing a connection of conductive patterns through a dielectric material, to a large extent, a conductive land and line are provided on the surface of the dielectric material. However, the presence of a land is undesirable on the dielectric material since it takes up valuable area on the dielectric material which could be used for other purposes.

For instance, certain techniques have been suggested for providing landless through-hole connections. Such techniques include those suggested by Crimi, et al. in IBM Technical Disclosure Bulletin, Volume 9, No. 10, March 1967; Mead, IBM, Technical Disclosure Bulletin, Volume 13, No. 1, June 1970; Chumbres, et al., IBM Technical Disclosure Bulletin, Volume 15, No. 10, March 1973; and U.S. Pat. No. 4,704,791 to Chellis, et al. However, for those circuit boards and cards that have internal signal planes, it is desirable to provide electrical connection between an external layer and an adjacent internal signal layer through the use of a blind via. Blind vias are advantageous since the number of inner connections can be doubled compared to employing through holes or vias. In particular, blind vias can be applied to both sides of the circuit board or card at the suitable site.

Furthermore, the current surface geometry for a solder ball connection (SBC) or flip chip attachment (FCA) requires a "dogbone" pattern wherein one end is used for the SBC mount and the other end is used to contain the via for signal distribution. Mounting the substrate such that the solder ball is directly on the via site is not possible in such configurations since the solder must be constrained to maintain correct solder height and prevent substrate collapse or unconnected solder joints.

SUMMARY OF INVENTION

It is therefor an object of the present invention to provide a method which makes it possible to fabricate a solid land to which the desired substrate can be connected without danger of solder runout. Another object of the present invention is to be able to fabricate a blind inner connection between an external signal plane and a buried signal plane without the need of an aperture in the surface land/pad. The method of the present invention makes it possible to provide for increased wiring density and makes possible the use of extremely small vias and lands.

But particularly, the present invention is concerned with a process for connecting at least two electrically conductive patterns through a dielectric material by a landless electrical connection. The process of the present invention comprises providing a dielectric substrate having a conductive plane on one of the major surfaces thereof and a temporary support layer covering the conductive plane. The conductive plane is located between the dielectric substrate and the temporary support layer. Blind vias are provided in the dielectric substrate. Vias in the dielectric substrate are plated with electrically conductive material. In addition, the dielectric substrate is plated with the electrically conductive material. The temporary support layer is removed to thereby provide a landless electrical connection through the dielectric material. The conductive plane is available for providing external electrical conductive pattern.

BEST AND VARIOUS MODES FOR CARRYING OUT THE PRESENT INVENTION

Figure 1:
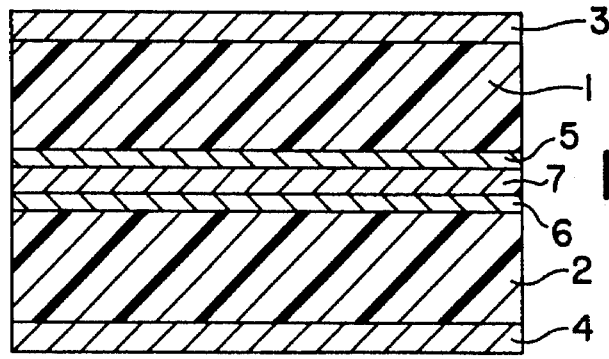
FIGS. 1–8 are schematic diagrams illustrating the method of the present invention for fabricating the landless via connection.
Figure 2:
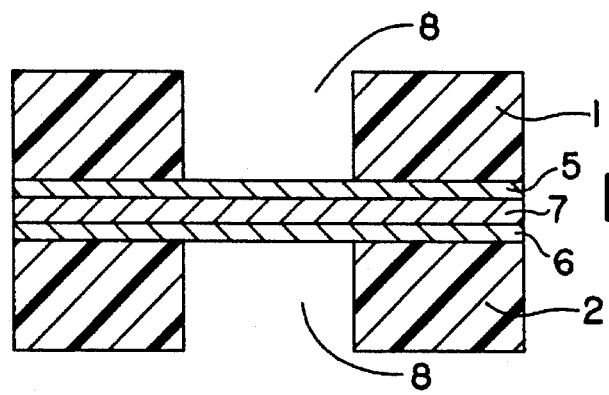

The present invention is concerned with providing electrical connection between at least two conductive patterns through a dielectric material. The process of the present invention provides for what is referred to as landless blind-via electrical connection.

Reference to the Figures will facilitate an understanding of the process of the present invention. In particular, pursuant to the present invention, a composite containing dielectric substrates 1 and 2 is provided. Located on top of dielectric substrate 1 is a release sheet 3 and located beneath a dielectric substrate 2 is a release sheet 4. On the other major surface of the dielectric substrate 1 and 2 are located electrically conductive layers 5 and 6 respective. Located between electrically layers 5 and 6 is temporary support layer 7.

The dielectric substrates 1 and 2 include both thermoplastic and thermosetting resins. Thermosetting polymeric materials include epoxy, phenolic base materials, polyimides and polyamides. Examples of some phenolic type materials include copolymers of phenol, resorcinol and cresol. Examples of some suitable thermoplastic polymeric materials include polyolefins such as polypropylene, polysulfones, polycarbonates, nitrile rubbers, ABS polymers, and fluorocarbon polymers such as polytetrafluoroethylene, polymers of chlorotrifluoroethylene, fluorinated ethylenepropylene, polyvinylidine fluoride and ployhexafluoropropylene. The dielectric materials may be molded articles of the polymers containing fillers and/or reinforcing agents such as glass filled polymers.

Typical FR-4 epoxy compositions that can be employed pursuant to the present invention contain 70–90 parts of borminated polyglycidyl ether of bisphenol-A and 10–30 parts of tetrakis (hydroxyphenyl) ethane tetraglycidyl ether cured with 3–4 parts of dicyandiamide, and 0.2–0.4 parts of a tertiary amine, all parts being parts by weight per 100 parts of resin solids. Another typical FR-4 epoxy composition contains 25 to about 30 parts by weight of tetrabrominated digylcidyl ether of bisphenol-A having an epoxy equivalent weight of about 350 to about 450: about 10 to about 15 percent by weight of a tetrabrominated glycidyl ether of bisphenol-A having an epoxy equivalent weight of approximate weight of about 600 to about 750: and about 65 to about 65 parts per weight of at least one epoxidized nonlinear novolak having at least six terminal epoxy groups: along with suitable curing and/or hardening agents. A still further FR-4 epoxy composition contains 70 to 90 parts of brominated polyglycidyl ether of bisphenol-A and 10 to 30 parts of tetrakis (hydroxphenyl) ethane tetraglycidyl ether cured with 0.8–1 phr of 2-methylimidazole. Still other FR-4 epoxy compositions employ tetrabromobisphenol-A as the curing agent along with 2-methylimidazole as the catalyst.

The thickness of each dielectric substrate 1 and 2 is typically about 1 to about 8 mils and more typically about 1.2 to about 2.8 mils.

Many of the dielectric substrates employed pursuant to the present invention are referred to as so-called prepreg substrates which contain a resin and a reinforcing fiber such as fiberglass.

Such compositions containing fibers are usually prepared by impregnating the fibers with, for instance, an epoxy polymer composition. The amount of the epoxy composition is usually about 30 percent to about 70 percent by weight and preferably about 50 percent to about 65 percent by weight of total solids content of the epoxy composition and the fiberglass.

After combining the resin with the fibers, the composition is cured to the B-stage and cut to the desired shape such as a sheet. The curing to the B-stage is generally achieved by using temperatures of about 80° C. to about 110° C. for about 3 minutes to about 10 minutes.

The conductive layers 5 and 6 are preferably copper and most preferably copper foils having a thickness of about 0.2 to about 4.8 mils and more typically about 0.5 to about 1.2 mils.

Separating the electrically conductive layers 5 and 6 from each other is a temporary support layer 7 that can be subsequently removed preferably by mechanical means. Suitable temporary support layers are polyimides such as Upilex SGA from UBE limited (a polyimide from diphenyltetracarboxylic dianhydride and a diamine); polyesters; and polyvinylfluorides such as Tedlar available from Dupont de Nemours and metallic layers as copper and aluminum. The material for the temporary support layer is selected so that it will not degrade during the processing. The temporary support layers is typically about 1 to about 4 mils thick and more typically about 2 to about 3 mils thick.

In addition, if desired, the composite can include release layers 3 and 4 to provide additional support during the initial stages of the fabrication. Examples of suitable release layers are chromium, lead, nickel, aluminum and silver.

The composite is typically prepared by laminating the various layers to each other. The lamination can be carried in a preheated laminating press at a predetermined pressure and temperature as, for example, about 200 psi to about 700 psi and more typically about 200 psi to about 500 psi at about 170° to about 300° C. The pressing operation is variable depending upon the particular materials employed and the pressure applied. About 200 psi is adequate for the above conditions.

Next, blind vias 8 are formed in the composite. Such are formed by drilling or punching operations including mechanical drilling and most preferably laser drilling. Excimer laser drilling is preferred since such process minimizes the depth control needed to avoid connection at an undesired level due to over shooting and punching through the conductive layers 5 and 6. When employing mechanical drilling, greater care is necessary to avoid drilling to great a depth and to ensure that a blind via would extend to the desired buffed land level. In addition, excimer laser drilling can produce relatively small blind via connections as desired without requiring elaborate post-drill cleaning procedures as typically experienced with mechanical drilling. The excimer laser drilling is tuned so that such will penetrate the dielectric but will automatically be stopped at the internal continuous electrically conductive layer 5 or 6.

The type of laser drilling depends upon the material employed. For instance, when the material is a FR-4 epoxide, the laser drilling is typically carried out employing a carbon dioxide laser. For a polyimide, the laser drilling is typically an excimer laser. The laser can be a pulse or a continuous wave output, but preferably is a pulse output for drilling epoxides and polyimides. Typically, the laser for polyimides employs an energy of about 0.5 to about 15 Joules/cm$^2$ and preferably about 1.0 to about 10 Joules/cm$^2$ when lasering materials from 0.1 to 2.5 mils thick. Typically, the laser for epoxides employs an energy of about 10,000 to about 30,000 Joules/cm$^2$ and preferably about 10,000 to about 15,000 when lasering materials from 0.1 to 2.5 mils thick.

The laser is directed to the predetermined desired locations by employing a dot etch mask which is typically made of glass with chrome etch features.

Typically, the vias are relatively small about 1 to about 10 mils in diameter and more typically about 2 to about 4 mils in diameter.

After the vias 8 are provided, release layers 3 are mechanically or chemically removed. In a typical application, this is a sheet of copper or aluminum which is etched. This could be released with an organic film layer which is peeled off. Then the vias are plated with electrically conductive material to thereby provide desired inner connections. For instance, a suitable catalyst is deposited in the through-holes and on the surfaces 1 and 2 prior to contact with an electroless plating bath. Among the more widely employed procedures for catalyzing or seeding a substrate is the use of a stannous chloride sensitizing solution and a palladium chloride activator to form a layer of palladium particles.

For instance, one method for catalyzing a dielectric substrate is exemplified by U.S. Pat. No. 3,011,920 which includes sensitizing the substrate by treating it with a solution of colloidal metal, accelerating the treatment with a selective solvent to remove protective colloids from the sensitized dielectric substrate, and then electroless depositing copper onto the sensitized substrate.

Also, as suggested, for example in U.S. Pat. No. 3,099,608, a dielectric substrate can be pretreated by depositing a thin film of "conductivator" type metal particles such as palladium metal from a semi-colloidal solution onto the dielectric substrate to provide a conducting base which permits electroplating with a conductive metal on the "conductivated" base.

More recently, U.S. Pat. No. 4,066,809 discloses the use of a so-called triple seeding technique. This techniques includes contacting the surfaces of the dielectric substrate first with a stannous chloride sensitizing solution, then with a palladium chloride activator and then with a palladium chloride/stannous chloride/hydrochloride acid seeder bath.

In addition, prior to the stannous chlorida and palladium chloride treatment, the substrate and vias can be treated with a aqueous solution containing a multi functional ionic polymer as disclosed in U.S. Pat. No. 4,478,883 to Bupp et al. and U.S. Pat. No. 4,554,182 to Bupp et al. disclosures of which are incorporated herein by reference.

The polymer is a multi functional ionic polymer in that it contains at least two active or available ionic functional moieties of the same polarity. The polymers are at least water miscible and are preferably water soluble or at least soluble in the water compositions employed. The preferred ionic moieties are cationic moieties such as quaternary phosphonium and quaternary immonium groups. Such polymers are commercially available and include Reten 210, Reten 220 and Reten 300 available from Hercules. The ionic polymer is typically employed as a dilute aqueous solution of about 0.01 percent to about 1 percent by weight and more usually 0.05 percent to about 0.5 percent by weight of the copolymer. The aqueous solution typically contains an inorganic acid such as $H_2SO_4$ or HCl to provide a pH of about 0 to about 7 and more typically a pH of about 0 to about 3.

After treating with the ionic polymer if desired the structure can be rinsed such as with deionized water in order to remove any excess polymer not absorbed on the substrate or in the vias.

Next, the substrate and vias are activated by contact with the composition containing a catalytic composition capable of initiating the electroless plating process. The compositions containing metal which can directly provide the catalytic sites will serve as a precursor which lead to the catalytic sites. The metal present may be in the elemental form, alloy, compound, or mixtures thereof. The preferred metal catalysts are precious metals such as gold, palladium and platinum.

Figure 3:
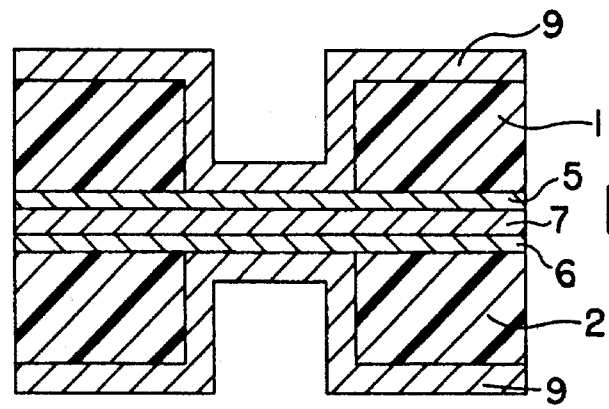

Next, the substrate and vias are plated with a electrically plated metal such as nickel or copper by contacting the structure with an electroless plating bath to provide layer 9 (See FIG. 3). The preferred metal employed is copper. Suitable copper electroless plating baths and their method of application are disclosed in U.S. Pat. Nos. 3,844,799 and 4,152,467 disclosures are incorporated herein by reference.

The copper electroless plating bath is generally an aqueous composition which includes a source of cupric ion an reducing agent, a complexing agent for the cupric ion and a pH adjuster. The plating baths also can contain a cyanide ion source and surface-active agent.

Figure 4:
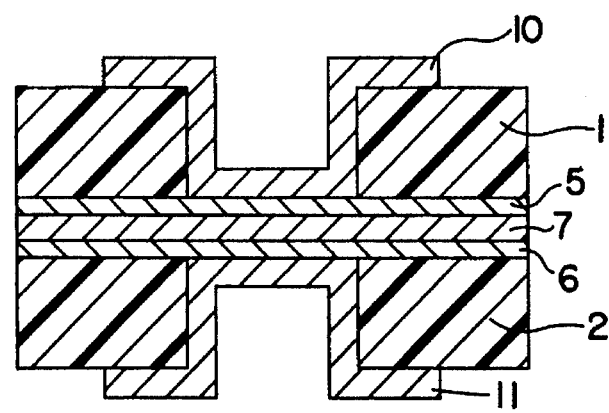
Figure 5:
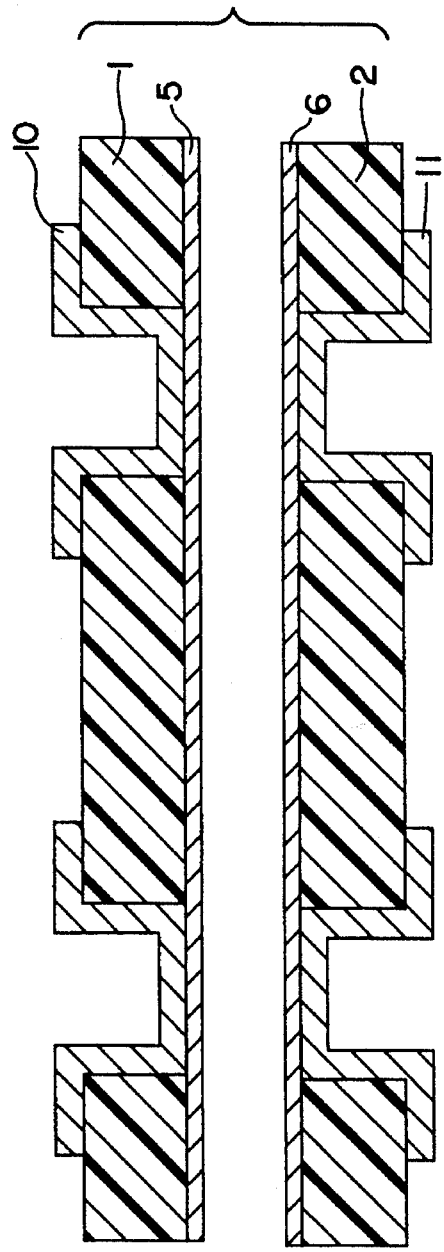

The thickness of layer 9 is about typically 0.2 to about 2.0 mils and more typically 0.5 to about 1.5 mils. The layer 9 is then patterned to provide the desired signal circuitry (layers 10 and 11) by employing conventional photolithographic techniques (See FIG. 4).

Next, the signal layers 10 and 11 are separated from separator sheet 7 by merely physically peeling the signal layers away from separator sheet 7.

Figure 6:
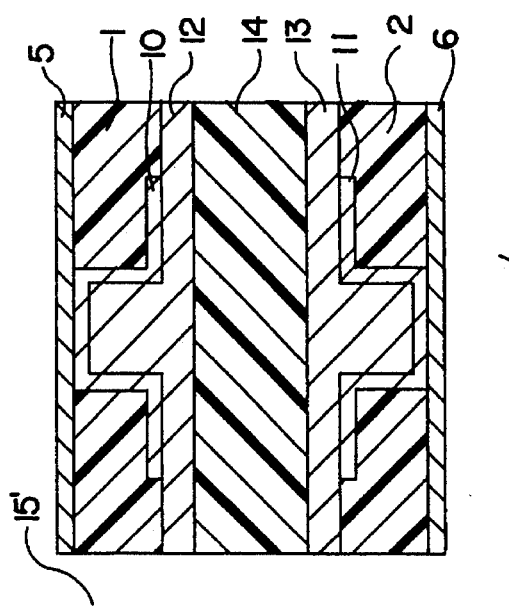
Figure 6:
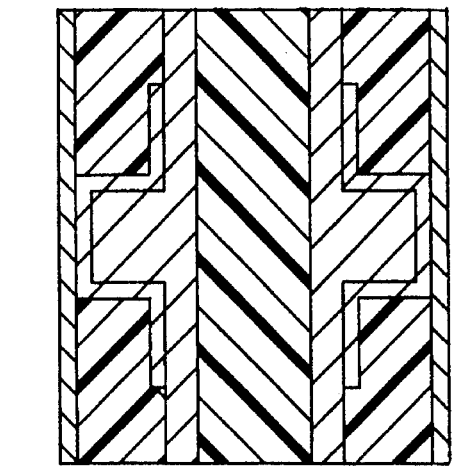
Figure 7:
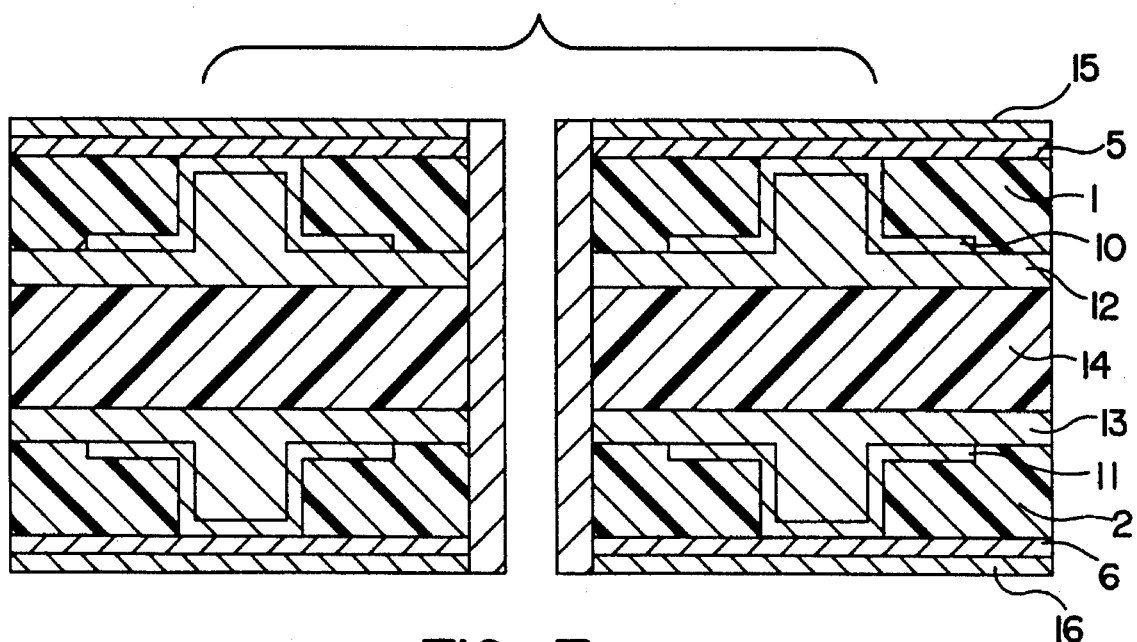
Figure 8:
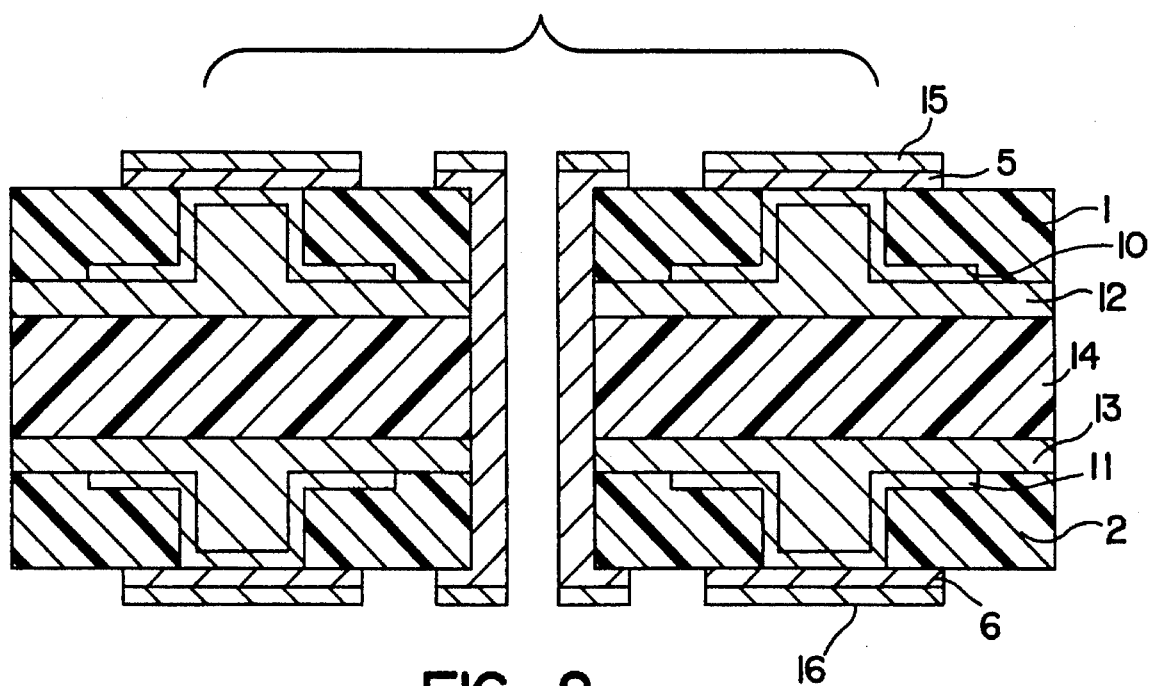

Each signal layer can then be employed as shown in FIG. 6 in a composite that includes internal conductive layers 12 and 13 as well as internal dielectric layer 14. The materials employed for these internal layers are the same materials as employed for the various layers of the signal layers as discussed above. In addition, through-hole 15 are provided such as by mechanically drilling or punching. The through-holes and composite are then plated with an electroless plating composition as discussed above (See FIG. 7). Layers 15 and 16 are each typically about 0.2 to about 2.0 and more typically about 0.5 to about 1.2 thick. Next, the external electrically conductive layers are patterned by employing well known photo lithographic techniques to provide the configuration in FIG. 8. As apparent from FIG. 8, a semiconductor chip can be mounted directly on the interconnecting rather than requiring an external signal line from the mounting pad to the via.

What is claimed is:

1. A process for connecting at least two electrically conductive patterns through a dielectric material by a landless electrical connection which comprises:

(a) providing a dielectric substrate having a conductive plane on one of the major surfaces thereof and a temporary support layer covering said conductive plane, where by said conductive plane is located between said dielectric substrate and said temporary support layers;

(b) providing blind vias in said dielectric substrate;

(c) plating vias in said dielectric substrate and on said dielectric substrate with an electrically conductive material;

(d) removing said temporary support layer to thereby provide a landless electrical connection through said dielectric material whereby said conductive plane is available for providing external electrical conductive pattern.

2. The process of claim 1 wherein said dielectric substrate includes an epoxy composition.

3. The process of claim 1 which further includes providing release layer on said dielectric substrate and removing said release layer prior to the plating of vias.

4. The process of claim 1 which includes providing at least two dielectric substrates each having a conductive plane on a major surface thereof with conductive plane of one substrate facing the conductive plane of the other substrate, and a temporary support layer located between the conductive plane of opposing substrates.

5. The process of claim 1 wherein said temporary support comprises a polyimide from diphenyltetracarboxylic dianhydride and a diamine.

6. The process of claim 1 wherein said blind vias are provided by laser drilling.

7. The process of claim 1 wherein said vias are about 1 to about 10 mils in diameter.

8. The process of claim 1 wherein vias are plated with copper.

9. The process of claim 1 wherein an electrically conductive signal layer is provided on said dielectric substrate prior to removing said temporary support layer.

10. The process of claim 1 which further involves including the product from step (d) in a composite whereby said conductive plane provides external electrical conductive pattern.

* * * * *